United States Patent [19]
Andrews

[11] Patent Number: 5,796,636
[45] Date of Patent: Aug. 18, 1998

[54] APPARATUS FOR AND METHOD OF TESTING AN ELECTRICAL GROUND FAULT CIRCUIT INTERRUPT DEVICE

[76] Inventor: Lowell B. Andrews, 2181-13th Ave. SW., Largo, Fla. 34640

[21] Appl. No.: 678,861

[22] Filed: Jul. 12, 1996

[51] Int. Cl.$^6$ ............................ H02H 3/093; G01R 19/00
[52] U.S. Cl. .................... 364/571.01; 364/483; 364/492; 361/93
[58] Field of Search .................. 364/571.01, 492, 364/480, 481, 483; 361/42, 45, 46, 115, 93, 94; 324/415, 424

[56] References Cited

U.S. PATENT DOCUMENTS

| | | | |
|---|---|---|---|
| 3,898,557 | 8/1975 | Strock | 324/51 |
| 4,039,932 | 8/1977 | Duckworth | 324/28 |
| 4,135,129 | 1/1979 | Johnston et al. | 324/51 |
| 4,161,027 | 7/1979 | Russell | 364/492 |
| 4,280,092 | 7/1981 | Wells, Jr. et al. | 324/51 |
| 4,292,585 | 9/1981 | Charette | 324/51 |
| 4,338,647 | 7/1982 | Wilson et al. | 364/492 |
| 4,550,360 | 10/1985 | Dougherty | 361/93 |
| 4,680,706 | 7/1987 | Bray | 364/483 |
| 4,717,985 | 1/1988 | Demeyer | 364/483 |
| 4,799,130 | 1/1989 | Emerson | 361/437 |
| 4,814,712 | 3/1989 | Burton et al. | 324/424 |
| 4,937,757 | 6/1990 | Dougherty | 364/492 |
| 4,979,070 | 12/1990 | Bodkin | 316/42 |
| 5,151,842 | 9/1992 | DeBiasi et al. | 361/93 |
| 5,334,939 | 8/1994 | Yarbrough | 324/424 |
| 5,363,047 | 11/1994 | Dresti et al. | 324/510 |
| 5,450,328 | 9/1995 | Janke et al. | 364/482 |
| 5,451,879 | 9/1995 | Moore | 324/418 |
| 5,475,609 | 12/1995 | Apothaker | 364/492 |
| 5,490,086 | 2/1996 | Leone et al. | 364/492 |

*Primary Examiner*—Emanuel T. Voeltz
*Assistant Examiner*—Bryan Bui
*Attorney, Agent, or Firm*—Foley & Lardner

[57] ABSTRACT

An apparatus for testing a ground fault circuit interrupt device includes a processor, an input device connected to the processor for receiving input from an operator, a storage media connected to the processor for storing test data, an output device connected to the processor for outputting information corresponding to the test data to the operator, and a calibrated variable load circuit connected between the processor and the ground fault circuit interrupt device. The ground fault circuit interrupt device is configured to trip a corresponding circuit breaker. The processor is configured to receive signals from the calibrated variable load circuit and to process the signals to determine a trip threshold current and/or a trip time. A method of testing the ground fault circuit interrupt device includes a first step of providing an identification for the ground fault circuit interrupt device. Test data is then recorded in accordance with the identification. By comparing test data from an initial test with test data from a subsequent test, a trend of performance for the ground fault circuit interrupt device is determined.

22 Claims, 15 Drawing Sheets

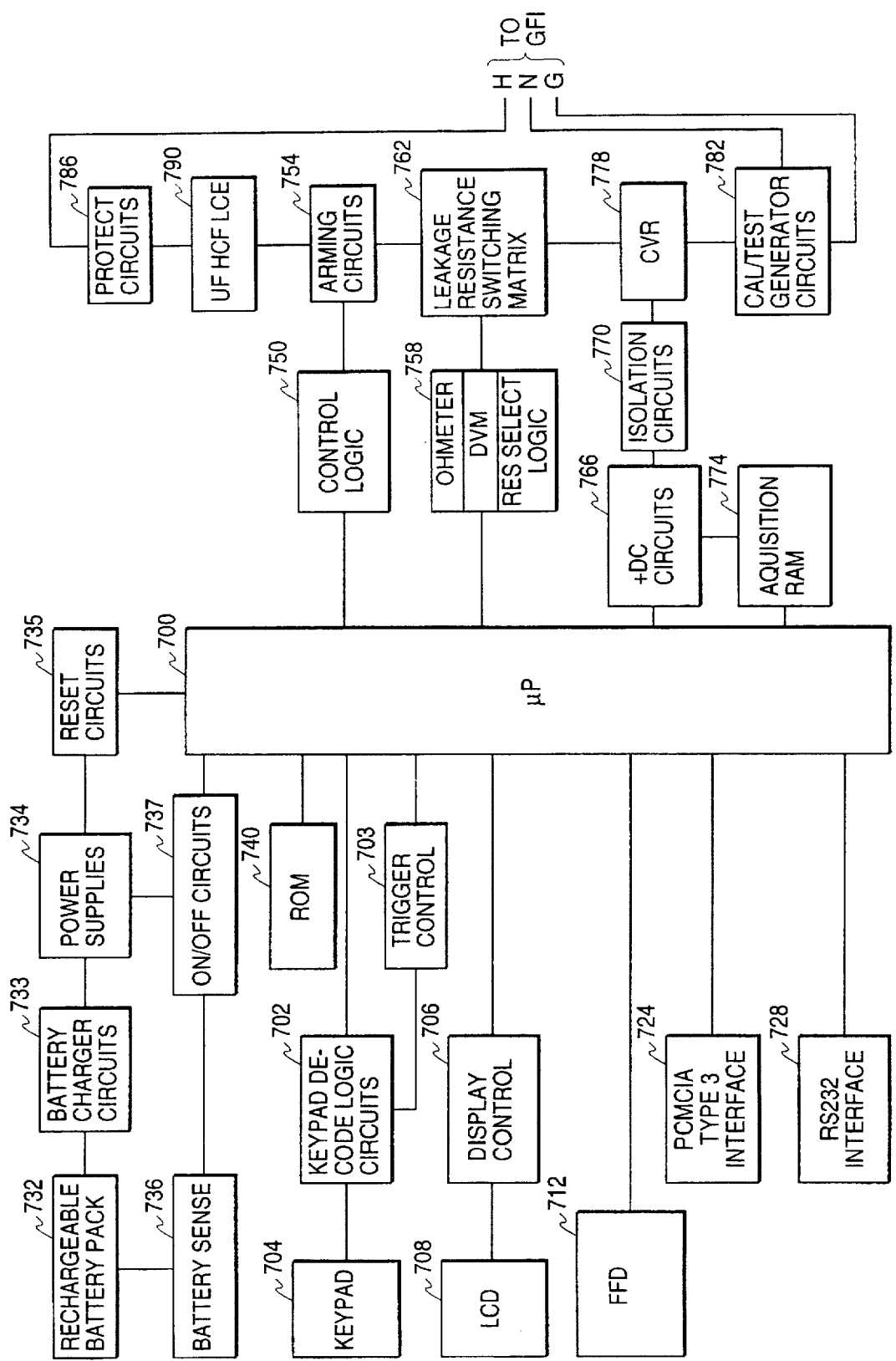

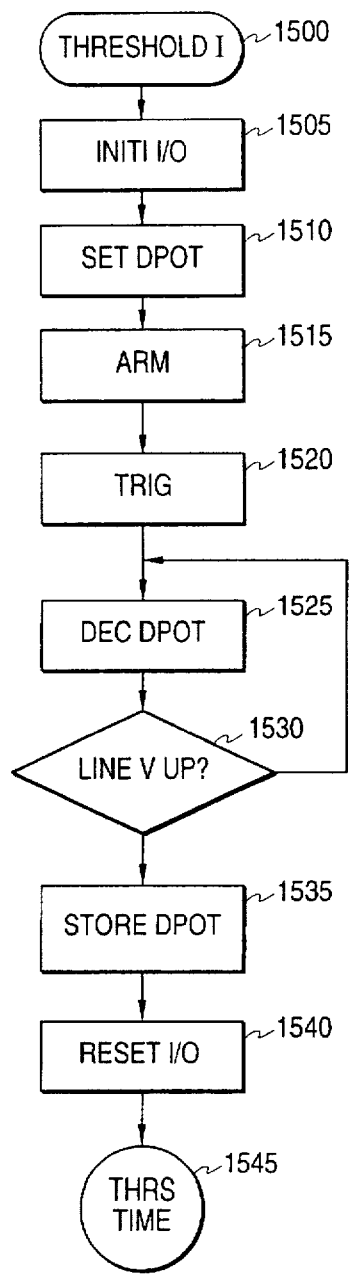
FIG. 15a
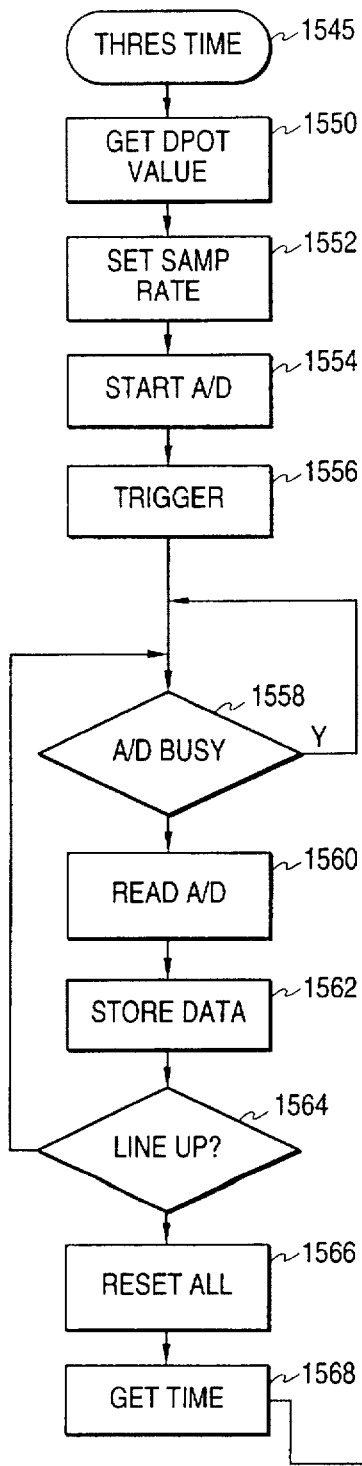
FIG. 15b
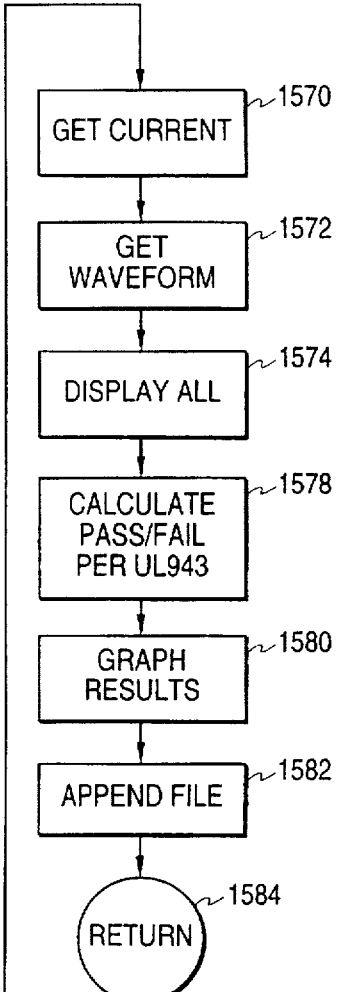

APPARATUS FOR AND METHOD OF TESTING AN ELECTRICAL GROUND FAULT CIRCUIT INTERRUPT DEVICE

The United States Government has rights in this invention pursuant to contract No. DE-AC04-92AL73000 between the United States Department of Energy and Lockheed Martin Specialty Components, Inc.

BACKGROUND OF THE INVENTION

1. Field of the Invention

The invention relates to testing an electrical ground fault circuit interrupt device. More particularly, the invention relates to a ground fault circuit interrupt device tester which produces quantified test results.

2. Related Art

A three wire electrical system includes a high voltage wire (also referred to as "hot"), a neutral wire, and a low voltage wire (also referred to as "ground"). In such a system, a ground fault circuit interrupt (GFCI) device monitors electricity flowing through a load connected between hot and neutral. Ideally, the current flowing into the load, $I_H$, is identical with the current flowing out of the load, $I_N$.

A difference between $I_H$ and $I_N$, beyond a pre-determined threshold, $I_T$, indicates a potentially dangerous connection between the hot and ground wires. The difference may be expressed as a fault current:

$$I_F = |I_H - I_N|$$

where $$I_F > I_T$$

indicates a fault condition. When the GFCI device detects a fault condition, the GFCI device trips a corresponding circuit breaker to remove power from the circuit.

Conventionally, only a very low level of test is performed on the GFCI device. For example, U.S. Pat. No. 5,334,939, issued to Yarbrough, shows a GFCI device tester which simulates a fault condition by placing a test circuit, consisting of a load resistor in series with a pushbutton switch, between the hot and ground wires. Pressing the pushbutton creates a short circuit between hot and ground. The results of the test consists solely of whether the circuit breaker tripped or not. In this conventional type of tester, nothing is measured or recorded.

Emphasis has also been placed on the current level and the time at which a circuit breaker trips. U.S. Pat. No. 4,292,585, issued to Charette, shows a GFCI device tester which measures the performance of a GFCI device in terms of milliamps required to trip and tripping time in milliseconds. The results of the tripping time are displayed on a digital readout. However, the GFCI device tester disclosed in Charette presents several disadvantages. For example, the measurement is time consuming because the measurement is performed manually by adjusting a potentiometer. Moreover, the measurement for the milliamps required to trip the breaker is inaccurate because no calibration is made of the load resistor.

Another disadvantage in the prior art is that the conventional GFCI device tester provides only a test of the then present condition of the GFCI device with no indication of a potential future failure.

What is desired is a GFCI device tester with improved accuracy and functionality, including the ability to track the performance of a GFCI device over time to provide an indication of future reliability of the GFCI device.

SUMMARY OF THE INVENTION

It is an object of the invention to overcome the above and other disadvantages in the prior art. Specifically, it is an object of the invention to provide an improved GFCI device tester which measures and plots the trip current and trip times of a GFCI device using calibrated components and circuitry. An exemplary application of the GFCI device tester according to the invention is the testing of GFCI devices such as those found in wall mounted receptacles, panel mounted breakers, end-of-cord breakers, and multiple-outlet extension cord type breakers.

It is a further object of the invention to collect and save test data pertaining to a GFCI device and to plot the data on a life code safety curve, as hereinafter defined.

It is a still further object of the invention to develop a trend for each tested GFCI device to provide an indication of future reliability.

The above and other objects of the invention are accomplished by a GFCI device tester including a processor, such as an embedded microcontroller, a display, a storage device, and an input device, such as a keypad or keyboard.

BRIEF DESCRIPTION OF THE DRAWINGS

These and other objects and advantages of the invention will be apparent from a review of the specification in light the drawings, wherein:

FIG. 7 is a block diagram of a third embodiment of a GFCI device tester according to the invention;

FIGS. 13, 14, 15a, 15b, and 16 are flow charts showing operation of a GFCI tester according to the invention for the fourth embodiment.

DETAILED DESCRIPTION OF THE PREFERRED EMBODIMENTS

Figure 1:
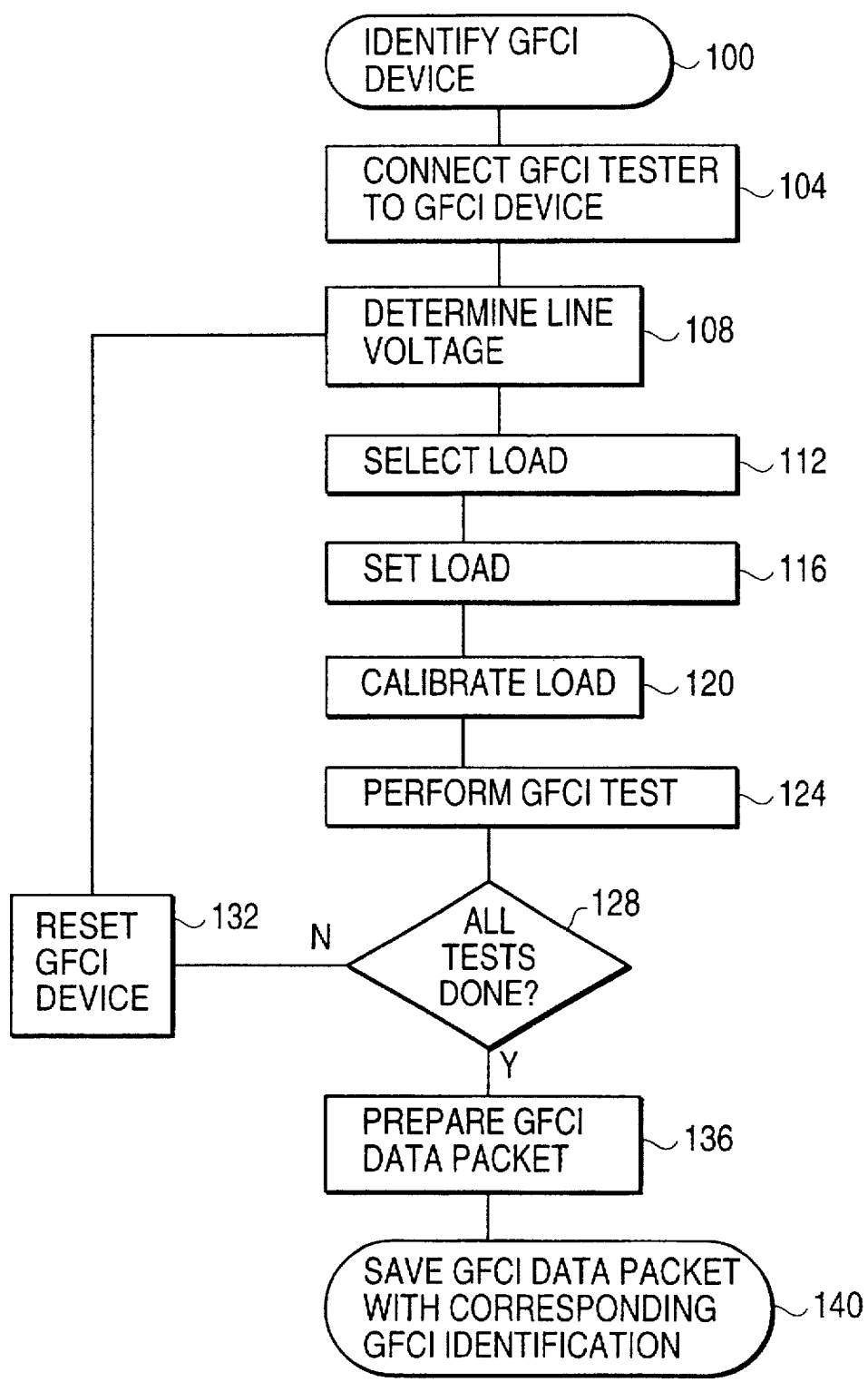
FIG. 1 is a flow chart of a method of testing a GFCI device according to the invention.

FIG. 1 is a flow chart of a method of testing a GFCI device according to the invention. In step 100, a GFCI device is provided with an identification, such as a number or a label. In step 104, the GFCI device is connected to a GFCI device tester according to the invention. Next, in step 108, the line voltage is determined. In steps 112 and 116, respectively, a load is selected and set in accordance with the line voltage determined in step 108. After the load is set, the load is calibrated in step 120. The GFCI tester performs a test on the GFCI device in step 124.

Calibrating the load prior to performing the test results in improved accuracy of the test results. Preferably, according to the invention, the load is calibrated immediately prior to the testing of the GFCI device.

Next, in decision step 128, a determination is made as to whether all tests have been performed. If not, the GFCI device is reset in step 132 and the process repeats from step 108 for another test of the GFCI device. According to the invention, the same test may be done more than once in order to verify repeatability of the measurement. Also, as hereinafter described, different tests may be performed to test various parameters of the GFCI device performance. Preferably, multiple tests are performed to determine trip times for a range of trip currents.

When all the desired tests have been performed, a GFCI data packet is prepared which represents the results of the tests in step 136. In step 140, the GFCI data packet is saved in association with the identification of the tested GFCI device.

For example, the GFCI device data packet may include the GFCI device identification, a test type, a test location, a line voltage, a trip threshold (and/or the waveforms corresponding thereto), and trip times for the various leakage current levels (and/or the waveforms corresponding thereto). Test types include a threshold trip current test, a trip time at the threshold trip current test, and a trip time at a predetermined current level test.

While the future performance of a GFCI device may not be predicted absolutely, periodic re-testing of a GFCI device, according to the invention, provides a trend of the GFCI device performance which may indicate when the GFCI device should be serviced or replaced. By associating a GFCI device identification with a tested GFCI device, subsequent tests may be correlated and/or plotted together to monitor the GFCI device for degradation in its performance as an indication of potential failure.

Figure 2:
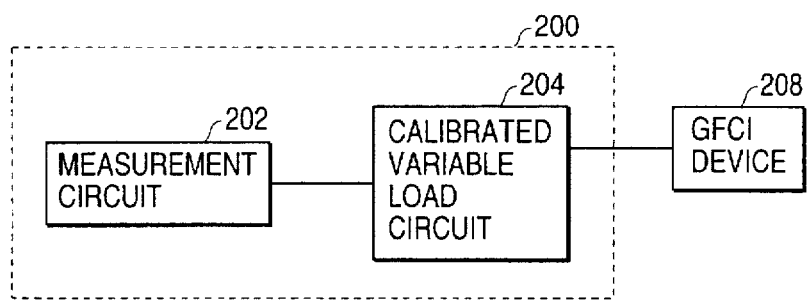
FIG. 2 is a block diagram of a first embodiment of a GFCI device tester according to the invention.

FIG. 2 shows a block diagram of a first embodiment of a GFCI device tester 200 according to the invention. The GFCI device tester includes a measurement circuit 202 coupled with a calibrated variable load circuit 204. The GFCI device tester 200 is shown connected to a GFCI device 208 for testing.

The previously described advantages of improved accuracy and GFCI device trending may be obtained irrespective of whether the method described with respect to FIG. 1 is performed utilizing a GFCI device tester according to the invention which performs the test manually or automatically. For example, FIGS. 3–5 show schematic diagrams of circuits suitable for use in a manual GFCI device tester according to the first embodiment of the invention.

Figure 3:
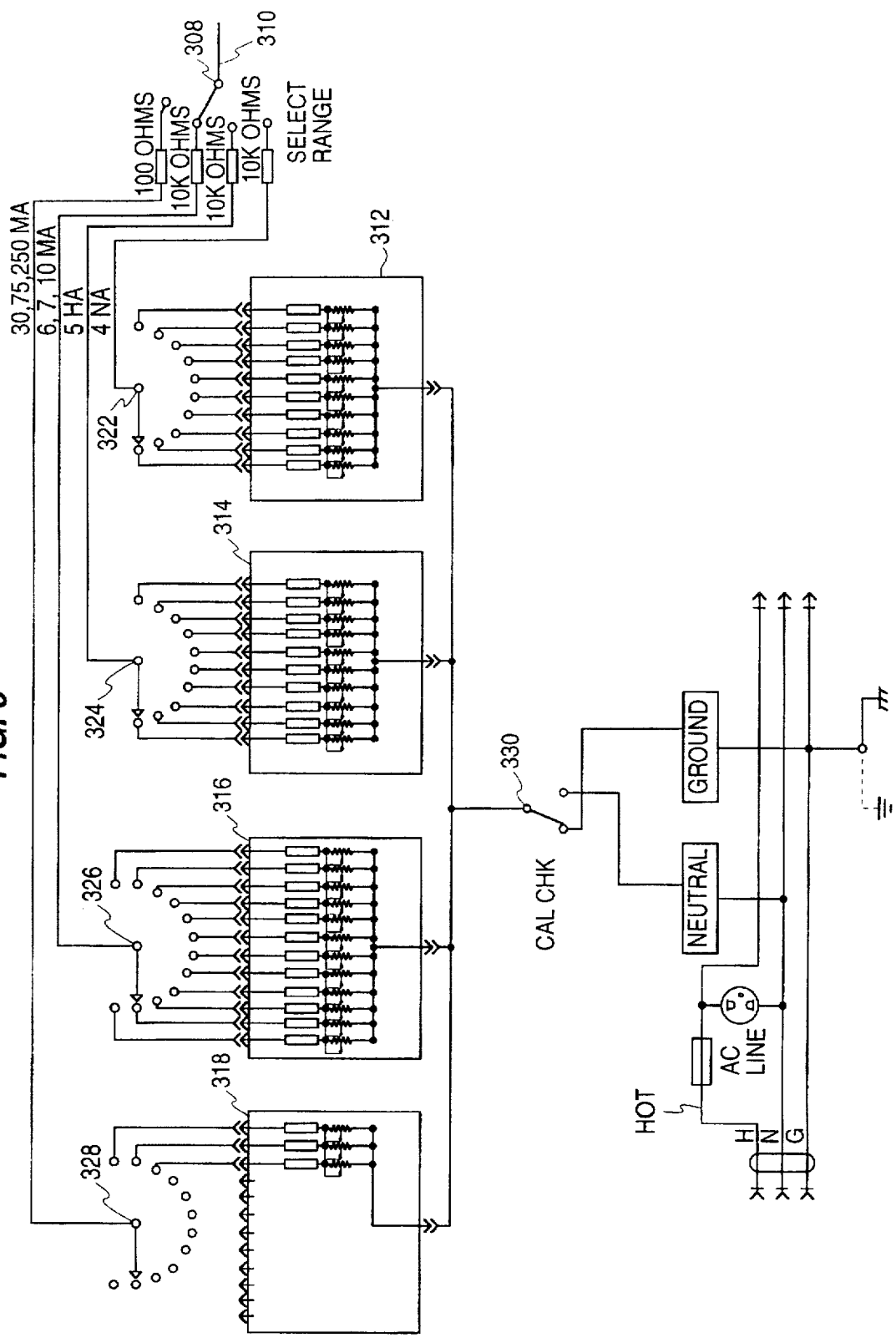
FIG. 3 is a schematic diagram of a variable load circuit according to the invention.

FIG. 3 is an exemplary schematic diagram of a calibrated variable load circuit 204 according to the invention. A switch 308 selects a current range. One side of variable resistor networks 312, 314, 316, and 318 are respectively connected to switch 308 via switches 322, 324, 326, and 328. The other side of variable resistor networks 312, 314, 316, and 318 are commonly tied and selectively connected to either the neutral wire or the ground wire by switch 330. When switch 330 is in the neutral wire position, current can be pulled through the load circuit without tripping the circuit breaker. This position is used to calibrate the load. The selected load is coupled to the measurement circuit via signal line 310.

Figure 4:
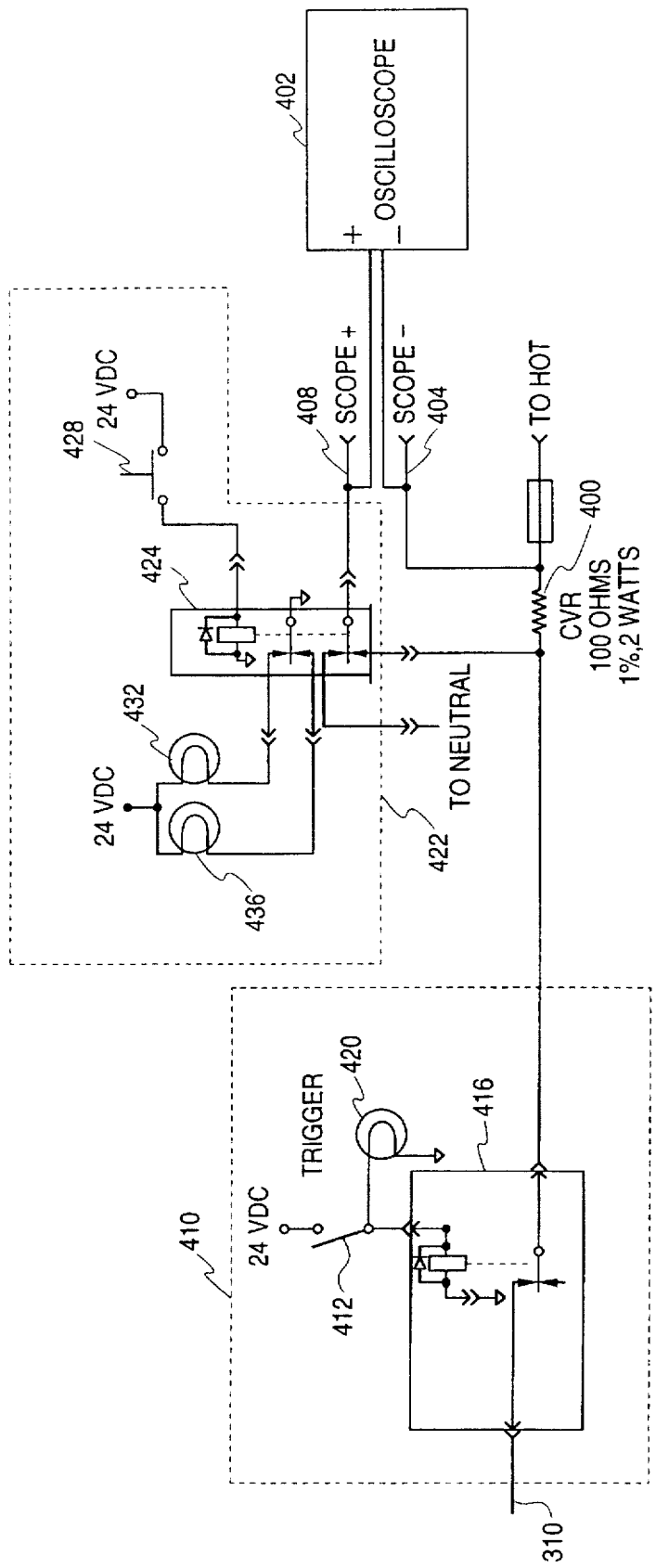
FIG. 4 is a schematic diagram of a measurement circuit according to the invention.
Figure 5:
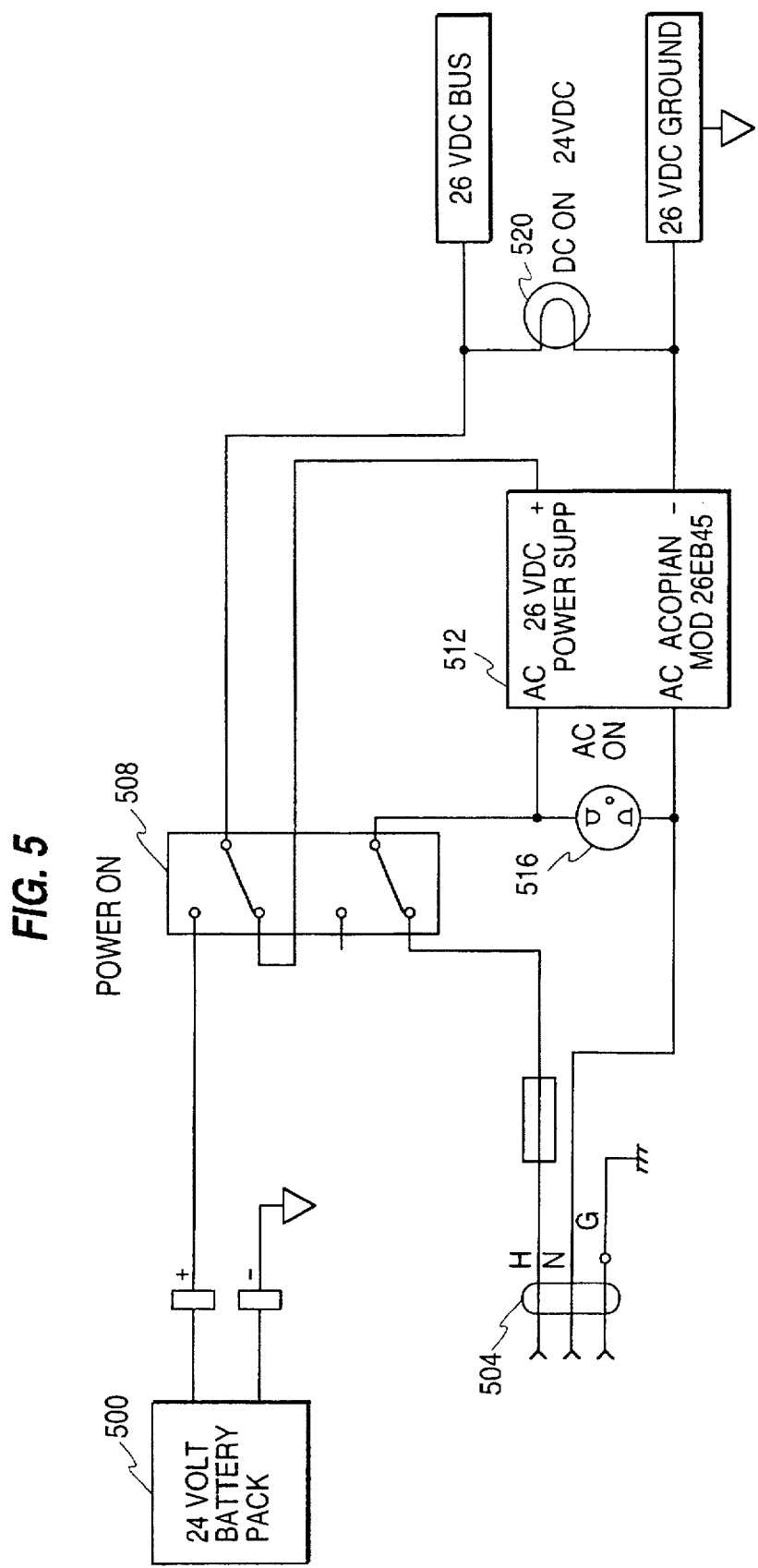
FIG. 5 is a schematic diagram of a power supply circuit according to the invention.

FIG. 4 is an exemplary schematic diagram of a measurement circuit 202 according to the invention. A current viewing resistor 400 has one side connected to the hot wire and a negative lead of an oscilloscope 402. The oscilloscope 402 is configured to show time and current measurements corresponding to signals applied to its negative and positive leads. Preferably, the oscilloscope 402 is a digital oscilloscope with waveform memory. Connected to the other side of the current viewing resistor 400 is a trigger circuit 410 and a switchable calibration/test circuit 422.

The trigger circuit 410 includes a switch 412 to selectively connect a 24 volt DC source to a relay circuit 416. When the 24 volt DC source is connected the relay circuit 416, the selected load is connected between the hot wire and the ground wire, via signal line 310. A light 420 is also connected to switch 412 to indicate that a test is being performed.

The switchable calibration/test circuit includes a relay circuit 424 to selectively switch between calibrating the selected load circuit and testing the GFCI device. A pushbutton switch 428 selectively connects the relay circuit 424 to the 24 volt DC source. One output of the relay circuit 424 is connected to a positive lead of the oscilloscope 402. The corresponding inputs of relay circuit 424 are selectively connected to either the trigger circuit 410 or the neutral wire. Another output of the relay circuit 424 is grounded. The corresponding inputs of the relay circuit 424 are selectively connected to light 432 or 436, which respectively indicate whether the circuit 422 is switched to calibrate the selected load or test the GFCI device.

When the relay circuit 424 is connected to the 24 volt DC source, the switchable calibration/test circuit 422 is switched to calibrate the load circuit and the output of the relay circuit 424 is connected to the neutral wire. During calibration, the oscilloscope 402 is configured to measure voltage across the selected load and current flowing through the selected load, from which a calibrated measurement of the selected load may be determined.

When the relay circuit 424 is not connected to the 24 volt DC source, the switchable calibration/test circuit 422 is switched to test the GFCI device and the output of the relay circuit 424 is connected to the trigger circuit 410. During testing, the oscilloscope 402 is configured to measure current flowing through the selected load over the period of time starting with the operation of switch 412 (triggering) and ending with the tripping of the circuit breaker, from which a measurement of the trip threshold current and trip time for the circuit breaker may be determined.

FIG. 5 is an exemplary schematic diagram of a power supply circuit for providing the 24 volt DC source according to the invention. The 24 volt DC source is selectively provided, via a switch 508, from a 24 volt battery pack 500 or a DC power supply 512 coupled to the AC wiring 504. Light 516 indicates that the AC wiring 504 is providing the 24 volt DC source. Light 520 indicates that the 24 volt DC source is on.

Figure 6:
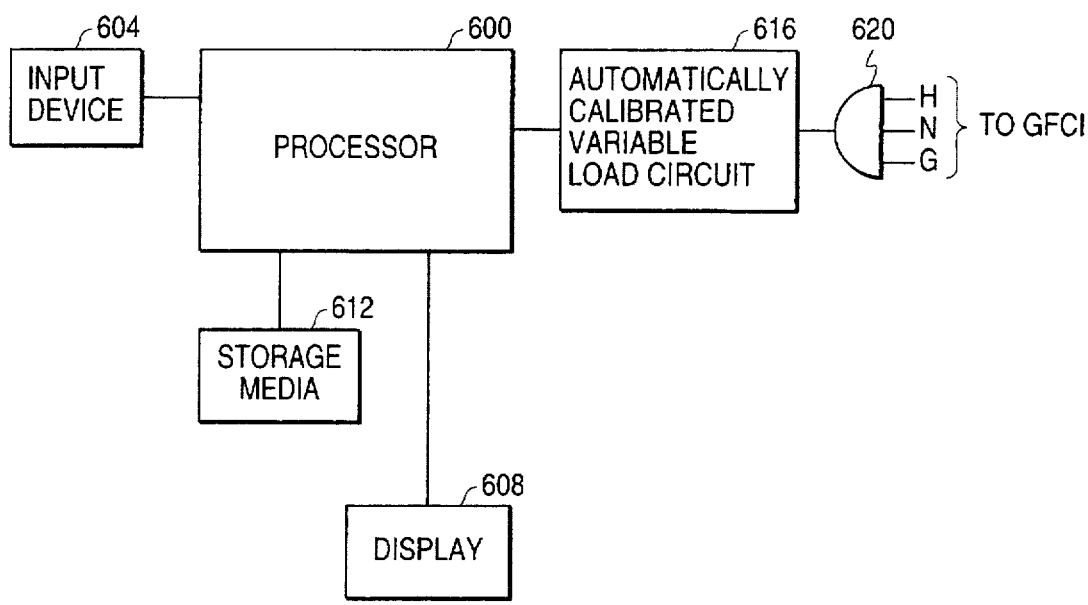
FIG. 6 is a block diagram of a second embodiment of a GFCI device tester according to the invention.

Preferably, according to the invention, the method described with respect to FIG. 1 is performed automatically. FIG. 6 shows a block diagram of a second embodiment according to the invention of an automatic GFCI device tester. A processor 600 receives operator input from an input device 604 and provides output to the operator via a display 608. The processor 600 is coupled to a storage media 612. By way of illustration and not limitation, input device 604 may be a standard personal computer (PC) keyboard, display 608 may be a flat panel LCD display, and storage media 612 may be a 1.44 MB floppy disk drive. The processor 600 is further coupled to an automatically calibrated variable load circuit 616 which may be connected to a GFCI device via a connector 620. The GFCI device tester according to the invention may be incorporated with a GFCI device but, preferably, and more economically, the GFCI device tester according to the invention is battery powered and portable so that one GFCI device tester may test many GFCI devices.

FIG. 7 shows a more detailed block diagram of a third embodiment of a GFCI device tester according to the invention. A processor 700 receives operator input from a keypad 704 via a keypad decode logic circuit 702. The keypad decode logic circuit 702 also provides a signal to a trigger control unit 703 which is connected to the processor 700. The processor 700 provides output to the operator on LCD display 708 via a display control unit 706. A floppy disk drive 712 is connected to the processor 700. The floppy disk drive provides, for example, storage of test data.

The processor 700 may support various other types of input/output interfaces. For example, as shown in FIG. 7, the processor 700 is connected to a PCMCIA Type 3 interface 724 and an RS232 serial interface 728. The PCMCIA interface 724, for example, may be coupled to a modem for communication with other devices. The serial interface 728, for example, may be coupled to a printer for hardcopy output of the test data.

The GFCI device tester according to the invention receives power from either a rechargeable battery pack 732 or from an external DC power source, such as an A/C adapter (not shown), through power supply circuit 734. When the GFCI device tester is connected to an external power source, a battery charger circuit 733 charges the rechargeable battery pack 732. A battery sense circuit 736 is connected to the rechargeable battery pack 732 to sense, for example, a low battery condition. An on/off circuit 737 is connected to the battery sense circuit 736 and the power supply circuit 734 to provide controlled power up and power down of the GFCI device tester. A reset circuit 735 is connected between the power supply circuit 734 and the processor 700.

The interface from the processor 700 to the GFCI device being tested includes a control logic unit 750 coupled to an arming circuit 754. The arming circuit 754 is further connected to a leakage resistance switching matrix 762. A calibration unit 758 provides a SELECT signal to the leakage resistance switching matrix 762 to select an appropriate resistance for testing the GFCI device. According to the invention, the GFCI device tester is automatically self-calibrating. For example, the calibration unit 758 includes an ohmmeter and a voltmeter for calibrating the GFCI device tester based on an actual leakage resistance measured after the leakage resistance switching matrix sets the leakage resistance value in accordance with the SELECT signal.

The leakage resistance switching matrix 762 is also coupled to a calibrated current viewing resistor (CVR) 778. The calibrated CVR 778 is coupled to the neutral and ground wires of the GFCI device via a calibration/test generator circuit 782. The hot wire is supplied to the arming circuit 754 via a protect circuit 786 and a circuit 790.

A high speed analog-to-digital converter (ADC) circuit 766, controlled by the processor 700, is connected to the calibrated CVR 778 via an isolation circuit 770. A data acquisition RAM 774 receives data from the ADC circuit 766 for further processing by the processor 700.

A detailed operation of the second embodiment of the GFCI device tester according to the invention is as follows. At power up, the processor 700 reads a control program from the ROM 740 (which may be, for example, an EPROM), and runs a self-test procedure. The self-test, among other things, checks all memory and I/O interfaces for proper operation. If the self-test passes, the processor 700 prompts the operator, via the display 708, for data entry including a test type. Based on the operator's response, a tester connection/configuration program provides instructions to the operator for performing the desired test. Typically, the instructions include instructing the operator to connect the GFCI device tester (for example, via a plug) to the GFCI device (for example, a wall outlet), and to enter an identification for the GFCI device.

Thereafter, a threshold test program automatically selects a load resistance to cause a pre-determined leakage current, for example 4 milliamps (ma), to flow between the hot and ground wires through the GFCI device. The load resistance is selected on the basis of a line voltage reading from the GFCI device. Once the load resistance has been selected, the resistance select logic of the calibration unit 758 sends the appropriate SELECT signal to the leakage resistance switching matrix 762 to set the selected load resistance.

The load, thus selected and set, is then connected, for example, via mercury wetted relay contacts, to the GFCI device. The ADC circuit 760 captures data from the calibrated CVR 778, according to a pre-determined sampling rate, and stores the data to the data acquisition RAM 774 to produce a current versus time waveform. Data capture begins, for example, before the load is applied, and continues, for example, until after the GFCI device trips the breaker or, if the breaker does not trip, until after a pre-determined time-out period has expired.

If the tested GFCI device does not trip the breaker, the load resistance is re-selected to increase the leakage current by a pre-determined amount, for example, 5 ma. The test is then repeated with the re-selected load resistance. The foregoing process continues until a trip threshold is determined. Once the trip threshold is determined, the test is typically repeated, for example, three times, to ensure reliability of the test.

The waveform in the data acquisition RAM 774 is accessed by the processor 700 for further processing. For example, the waveform may be plotted on the display 708 as a current versus time graph. The operator may, via the keypad 704, select an amplitude and/or time base for the graph. The waveform may be plotted with additional pre-trigger and/or post-trigger information.

The waveform, as represented in the data acquisition RAM 774 or as further processed by the processor 700, may be stored to the floppy disk drive 712 to keep a record of the test and/or for transfer to another computer system. For example, the waveform and/or other data may be transferred to a PC for maintaining a record of the test, for further data manipulation, for printing, or for plotting. Data may also be loaded into the GFCI device tester according to the invention via the floppy disk drive 712 or other input/output interfaces for display and/or analysis.

The GFCI device tester according to the invention is further configured to provide trip times for multiple predetermined current levels. For example, a test for the trip time of the GFCI device for leakage current of 6, 10, or 20 ma may be performed. As described above, a load resistance is selected to cause the desired leakage current. The test is run and repeated in accordance with a number of tests requested by the operator. After all the requested tests have been completed, the processor 700 determines an average trip time of the GFCI device for each of the various leakage current levels.

From the various tests described above, a life code safety curve may be plotted on the basis of the GFCI device test data. The life code safety curve is defined in the National Fire Protection Association (NFPA) #99 Life Code Safety Handbook, and generally shows the degree of electrical shock a person would experience if the GFCI device had performed as indicated by the test. As a safety guideline, the NFPA #99 handbook requires that a Class A GFCI device in a health care facility trip at a current of no more than 6 ma. Underwriters' Laboratory (UL) defines another standard, UL-943, which provides a safety guidelines for GFCI devices based on both trip current and trip time.

Another aspect of the third embodiment is identifying the tested GFCI device. For example, a bar code label with a unique identifier bar code may be affixed on or near a wall outlet with a corresponding GFCI device. The processor 700 may be coupled to a bar code scanner via the PCMCIA interface 724, the serial interface 728, or another input/output interface (not shown). As part of the test procedure, the processor 700 prompts the operator to scan the bar code associated with the GFCI device to input the GFCI device identification. The keypad 704 provides an alternate input device for the GFCI device identification if the bar code is missing or otherwise cannot be scanned. The results of the test of the GFCI device are compiled into a data packet with the associated GFCI device identification.

In order to develop a trend of performance for the GFCI device, the data packet from an initial test is stored on the floppy disk drive 712 in association with the GFCI device identification. After each subsequent test of the GFCI device, the data packets from each of the prior tests is compared with the data packet from the current test for an indication of a degradation in the performance of the GFCI device. Even if the GFCI device performs within acceptable performance parameters, a trend of performance degradation may indicate a potential future GFCI device failure. For example, a twenty percent (20%) increase, over time, in either the trip threshold current or the trip time may cause the processor 700 to output a warning message to the operator on the display 708. By identifying the trend of degradation in the GFCI device performance prior to actual GFCI device failure, the GFCI device may be serviced or replaced before an accident occurs due to a failure subsequent to testing.

Figure 8:
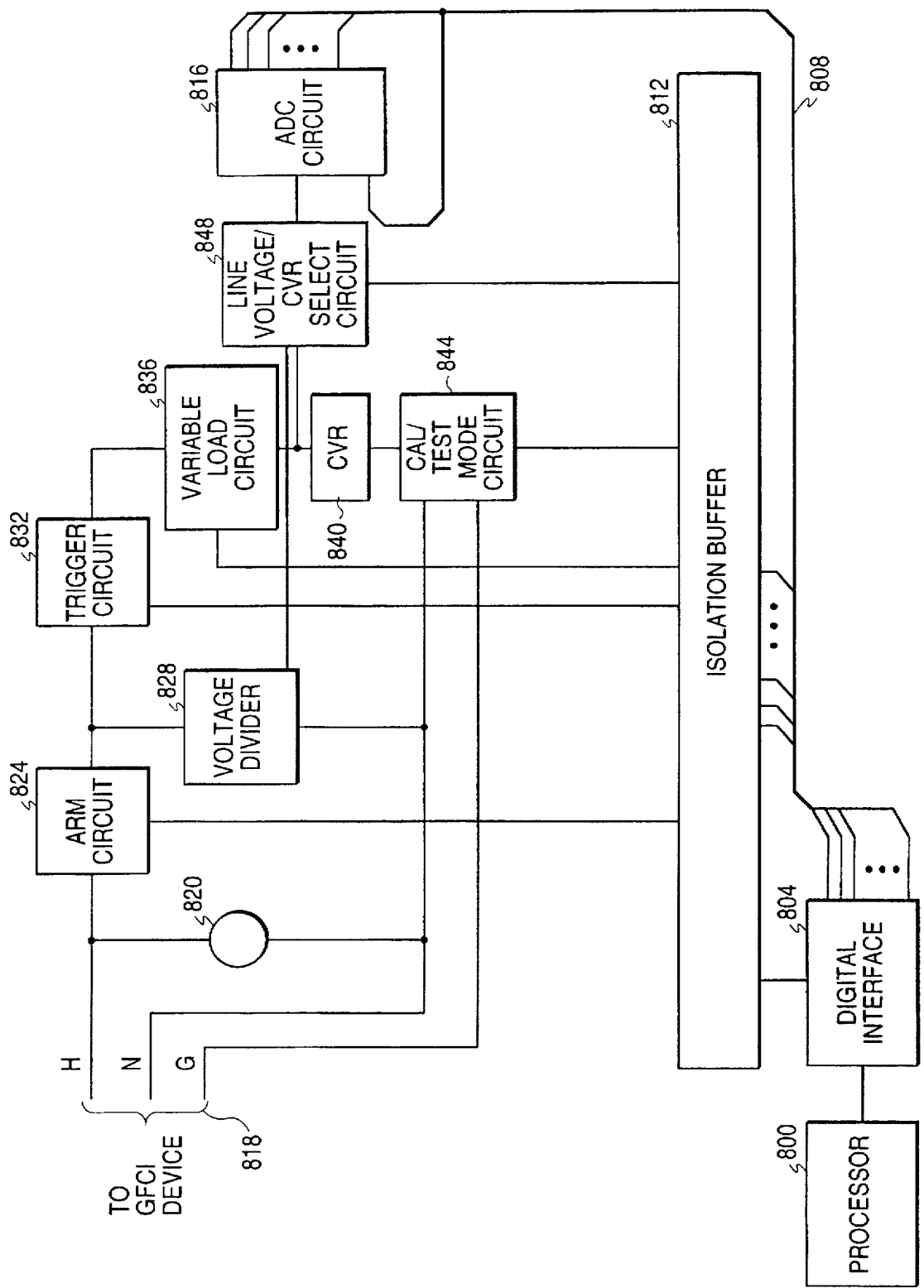
FIGS. 8 and 9 are block diagrams of a fourth embodiment of a GFCI device tester according to the invention.

FIG. 8 shows a block diagram of a fourth embodiment according to the invention of an automatic GFCI device tester. A processor 800 is coupled through a bi-directional digital interface 804 to a data/control input/output bus 808. Processor 800 may be, for example, a single board computer such as a Cardio 386, 20 MHz single board computer. According to the invention, the digital portion of the GFCI device tester is isolated from the analog portion of the GFCI device tester by an isolation buffer 812. The isolation buffer 812 receives data and control signals from the digital interface 804 and provides corresponding data and control signals to the various analog components. With respect to the analog portion of the fourth embodiment, as shown in FIG. 8, only the digital portion of an analog-to-digital converter circuit 816 is directly connected to the digital interface 804. Preferably, the isolation buffer 812 includes photo coupler circuits to provide the isolation and thereby minimize the effect of analog signal noise from the analog portion on digital signals in the digital portion.

The analog portion of the fourth embodiment includes a connector 818 for connecting to the hot, neutral, and ground wires of a GFCI device. A light 820 is connected between the hot and neutral wires to indicate the presence of a line voltage. Light 820 may be, for example, a neon lamp. The hot wire is provided to an arm circuit 824 which provides the hot wire as an output to a voltage divider 828 and a trigger circuit 832 in accordance with a control signal from the isolation buffer 812. The trigger circuit 832 also receives a control signal as input from the isolation buffer 812 and selectively provides the hot wire to a variable load circuit 836 in accordance with the control signal.

The variable load circuit 836 is connected in series with a current viewing resistor (CVR) 840. The variable load circuit receives a data signal from the isolation buffer and sets a desired load in accordance with the data signal. Preferably, the current viewing resistor 840 is a high precision pre-calibrated resistor having a tolerance of, for example, one percent (1%). A calibration/test mode circuit 844 receives a control signal from the isolation buffer and selectively connects the current viewing resistor 844 to either the neutral wire for calibration purposes or the ground wire for test purposes in accordance with the control signal.

A line voltage/cvr select circuit 848 receives a signal from the voltage divider 828 and a signal from the junction point of the variable load circuit 836 and the current viewing resistor 840 and selectively provides one of the signals as an output signal to the analog-to-digital converter circuit 816 in accordance with a control signal from the isolation buffer 812. The analog-to-digital converter circuit 816 produces a digital representation of the signal and provides the digital representation to the processor 800 via the digital interface 804.

Figure 9:
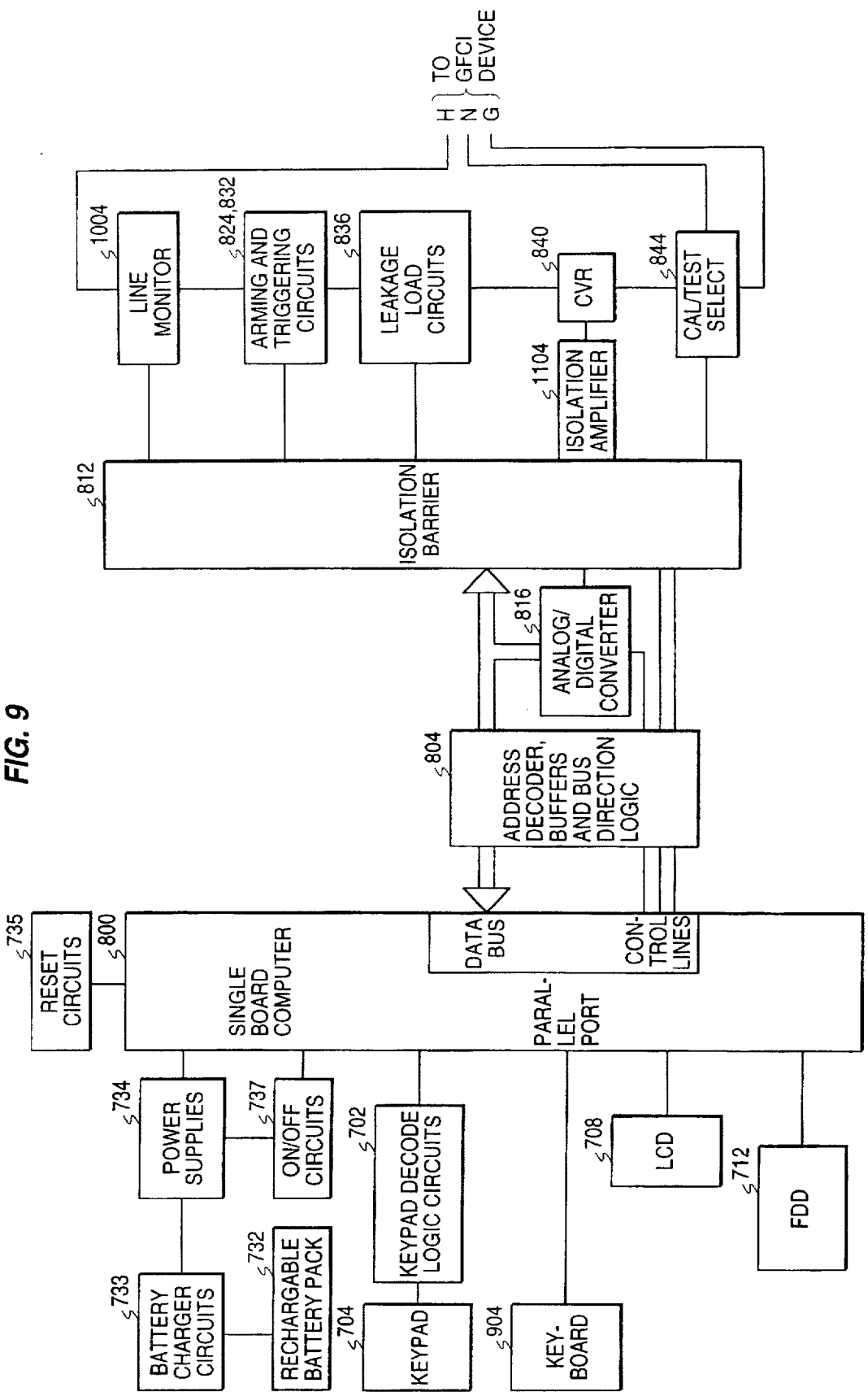
Figure 10:
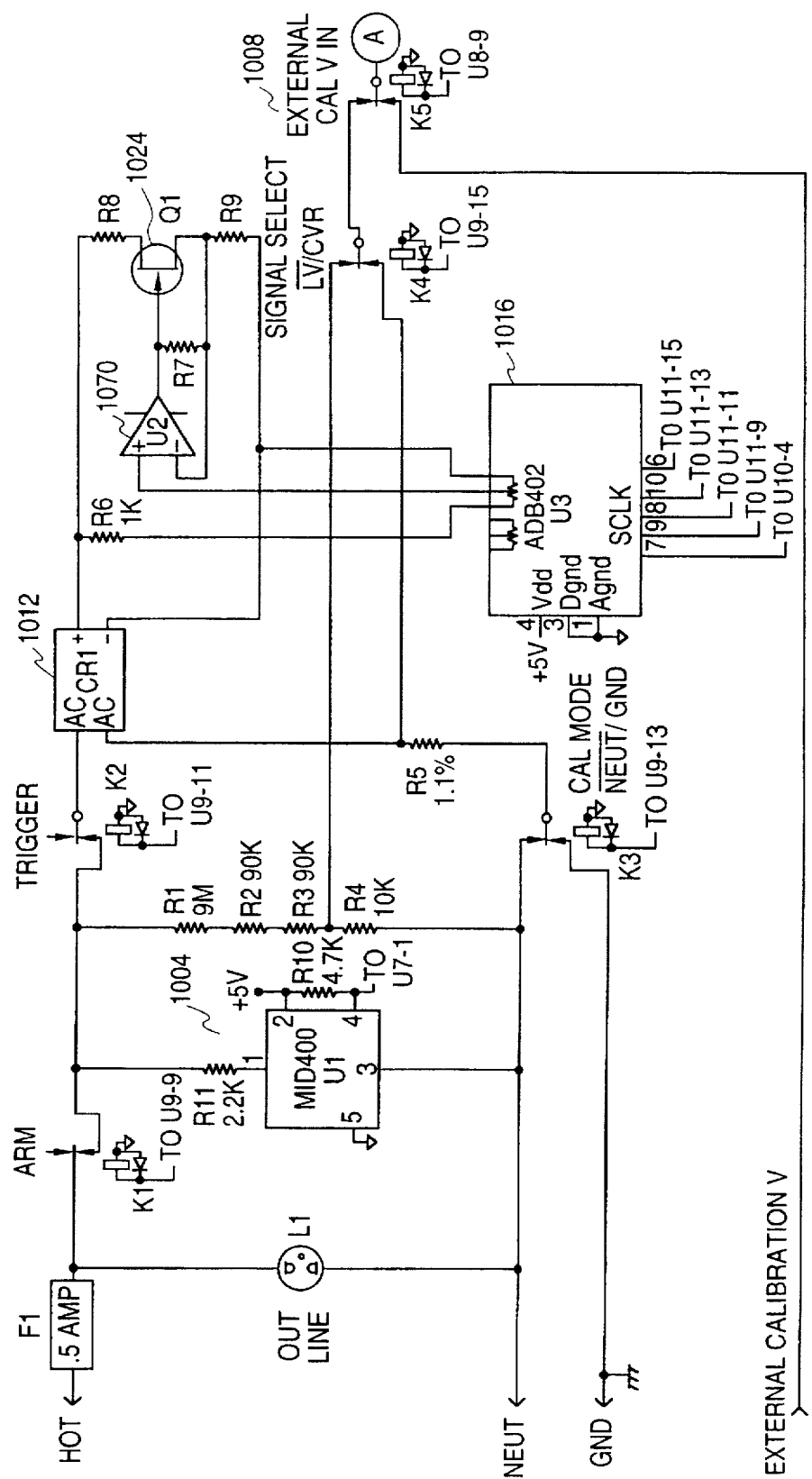
FIGS. 10, 11, and 12 show a schematic implementation of the fourth embodiment.
Figure 11:
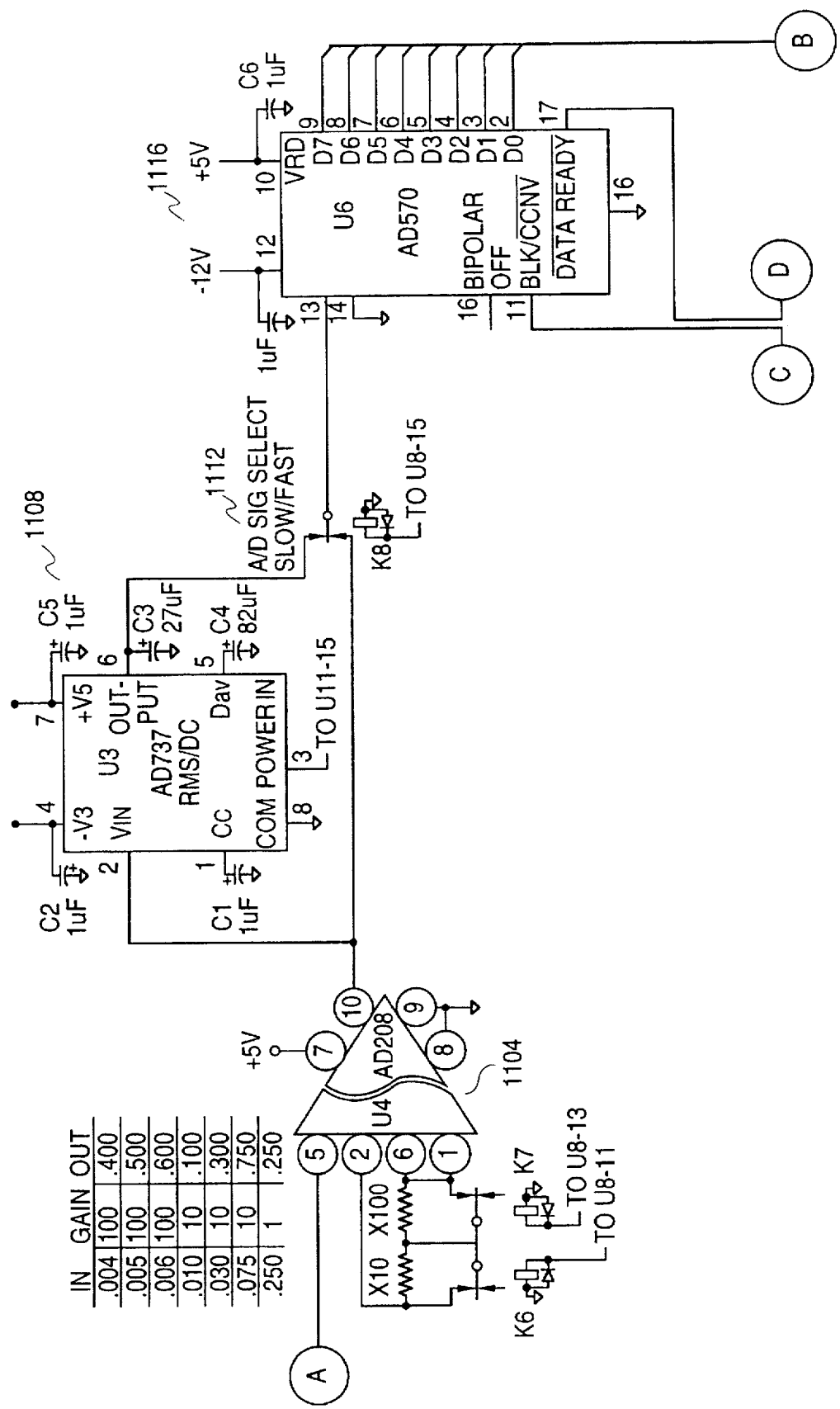
Figure 12:
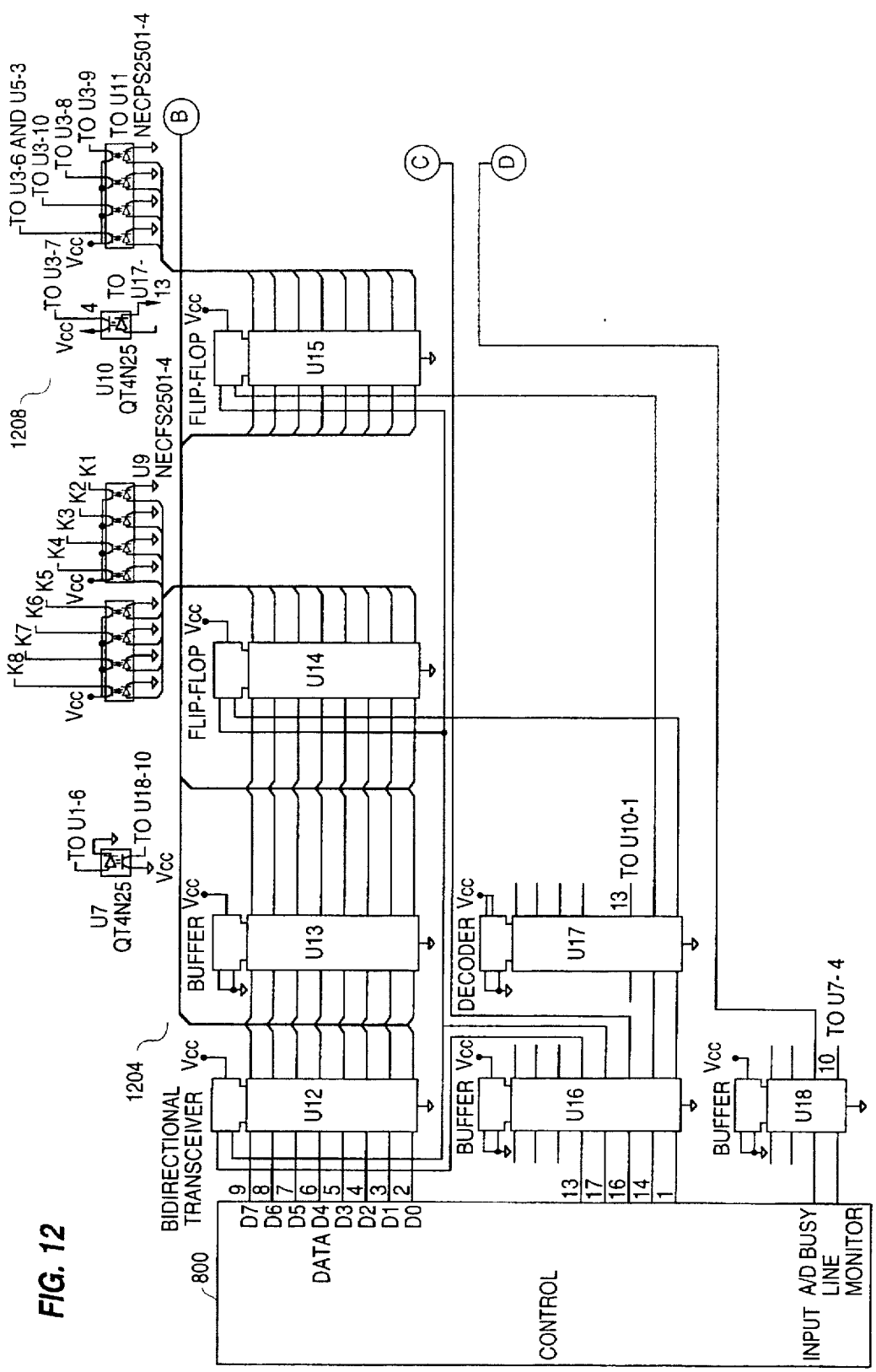

A more detailed block diagram of the fourth embodiment is shown in FIG. 9 with like reference numbers denoting like features. The GFCI tester shown in FIG. 9 includes a keyboard 904 for operator input. A detailed exemplary schematic implementation of the block diagram illustrated in FIG. 9 is shown in FIGS. 10–12. As shown in FIG. 10, the analog portion of the GFCI device tester includes an optional line monitor 1004 and a optional external calibration circuit 1008. The line monitor 1004 receives the hot wire as input as outputs a logic one to the processor via the photocoupler/digital interface. The external calibration circuit 1008 is interposed between the line voltage/cvr select circuit and receives an external calibration signal.

As shown in FIG. 10, the variable load circuit includes a full wave bridge 1012 interconnected with a digital potentiometer (Dpot) 1016, an operational amplifier (Opamp) 1020, and a field effect transistor (FET) 1024. The Dpot 1016 may be, for example, a 256 step variable resistor with serial control and addressing. The DC side of the bridge circuit 1012 is floated and acts to load the AC line at the desired trip current levels by setting an appropriate resistance value for the Dpot 1016. The Opamp 1020 drives the FET 1024 into conduction in accordance with the voltage at the non-inverting input of the Opamp 1020, based on the resistance value of the Dpot 1016, and the feedback loop from the FET 1024 to the inverting input of the Opamp 1020.

As shown in FIG. 11, the analog-to-digital converter circuit includes an isolation amplifier 1104 configured for unity (×1), ×10, and ×100 gain stages. The isolation amplifier 1104 provides full galvanometric isolation between the high voltage and low voltage DC circuitry. The analog-to-digital converter circuit also includes a True RMS-to-DC converter 1108, connected to the output of the isolation amplifier 1104, and a select circuit 1112 to selectively provide either the output from the isolation amplifier 1104 or the output from the True RMS-to-DC converter 1108 to an analog-to-digital converter 1116. During calibration mode, the output of the True RMS-to-DC converter 1108 is selected. During test mode, the output of the isolation amplifier 1104 is selected.

FIG. 12 shows the digital portion of the GFCI tester according to the fourth embodiment. The processor 800 is bi-directionally coupled to the digital interface electronics 1204 to input and output data and control signals. The digital interface electronics 1204 are interconnected with photocouplers 1208 to respectively provide signals to and receive signals from the analog portion and the analog side of the analog-to-digital converter 1116. The photocouplers 1208 provide electrical isolation between the analog and digital portions. The digital interface electronics 1204 also interface directly with the digital side of the analog-to-digital converter 1116.

From a high level of operation, the fourth embodiment is a portable battery powered GFCI device tester which is calibrated and measures GFCI device performance, for example, for compliance with UL 943 requirements. The tester provides a leakage path for a 60 cycle ground fault current. The fault current is acquired and digitized by the tester. The waveform is displayed on an LCD display with time markers (CURSERS) superimposed on the waveform at the time the GFCI device was triggered (start) and at the time the GFCI device tripped (stop). A profile of the GFCI device is developed from the data and plotted, for example, on a UL 943 graph.

A pass/fail status, for example, compliance with the UL 943 requirements, is determined. The tester saves the performance data, for example, to a floppy disk, as a data packet. The GFCI device is tested for line voltage level, threshold current trip level, threshold current trip time, and trip times at 6 ma, 10 ma, 30 ma, 75 ma, and at 250 ma. The data packet for the GFCI device includes a GFCI device identification and the data from each of the foregoing tests, for example, in a single file. Data packets from previously saved files may be recalled into the tester, for example, for comparison with a current data packet to determine whether the GFCI device performance has degraded, for display as a current vs. time waveform, or for display as data points on a compliance curve. Data packets may also be utilized by other equipment. For example, a data packet may be loaded on a personal computer for display, printing, or further analysis.

Figure 13:
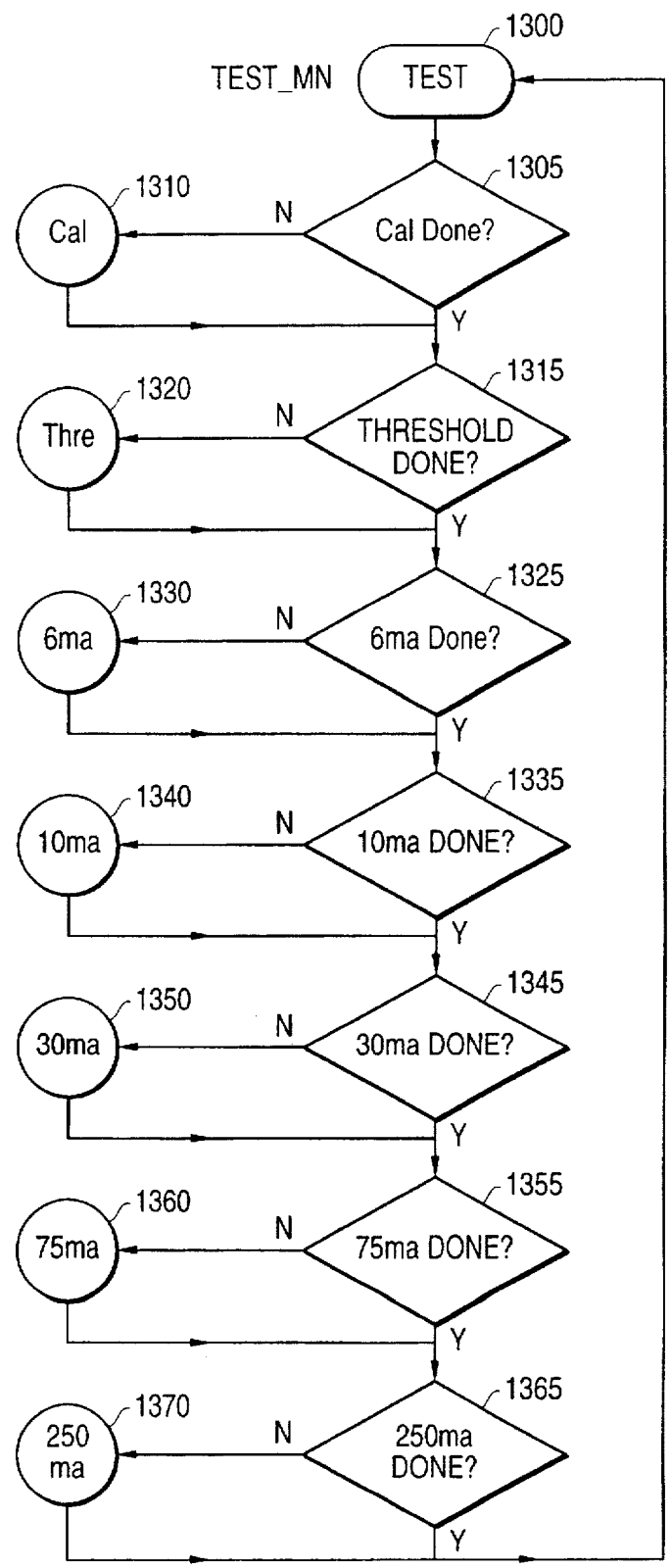
Figure 14:
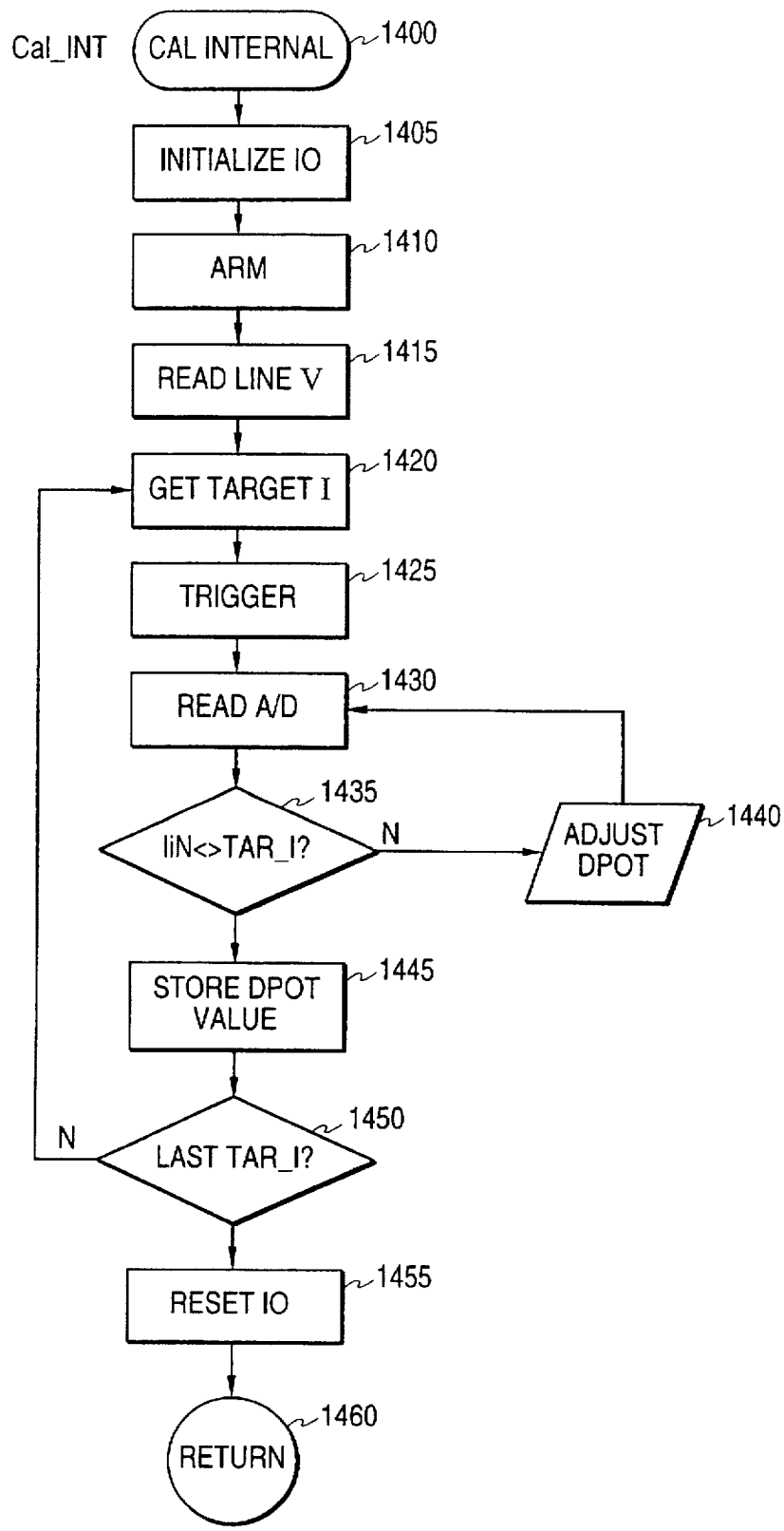

A more detailed exemplary operation of the fourth embodiment is hereinafter described with respect to FIGS. 13–16. FIG. 13 shows a main testing procedure for testing a GFCI device according to the invention. Upon initiation of the test (step 1300), a determination is made as to whether calibration has been performed (step 1305). If not, a calibration routine (step 1310), hereinafter described with respect to FIG. 14, is performed. Next, a determination is made as to whether the threshold tests have been performed (step 1315). If not, a threshold test routine (step 1320), hereinafter described with respect to FIGS. 15a and 15b, is performed. Next, a similar determination is made with respect to a trip time test for current levels of 6 ma (step 1325), 10 ma (step 1335), 30 ma (step 1345), 75 ma (step 1355), and 250 ma (step 1365), with a respective trip time routine (steps 1330, 1340, 1350, 1360, and 1370) hereinafter described with respect to FIG. 16, being performed for each current level. When all of the tests have been performed, the procedure returns to the initial test state (step 1300).

FIG. 14 is a flow chart of a calibration procedure according to the invention. The I/O for the GFCI device tester is configured for calibration (step 1400) and initialized (step 1405) and the tester is armed (step 1410. Next, the line voltage is read and a load is determined for each target current (step 1415). The load is set for the first target current (step 1420) and the tester is triggered (step 1425). The value read from the A-to-D is determined (step 1430) and compared with the target current (step 1435). If a discrepancy, beyond a pre-determined tolerance, exists between the actual read value and the target current, the Dpot is adjusted (step 1440) and a new value is read from the A-to-D (step 1430). When the actual read value matches the target value, the value of the load from the Dpot is stored in association with the target current for the subsequent tests (step 1445). The foregoing is performed for all target currents (step 1445), with respective load values being determined and stored for each target current (step 1420). Next, the I/O is reset and the GFCI device tester is configured for testing (step 1455). The routine then returns to the main testing procedure (step 1460).

FIGS. 15a and 15b are flow charts of a threshold testing procedure according to the invention. First, threshold current is determined by the procedure shown in FIG. 15a beginning with step 1500. The I/O is initialized (step 1505) and the Dpot is set to a predetermined value (step 1510). The tester is armed (step 1515) and triggered (step 1520). The Dpot is decremented by a pre-determined amount (step 1525) and a determination is made as to whether the line voltage is present (step 1530). The value of the Dpot is decremented (step 1525) until the line voltage is determined to no longer be present (step 1530), thereby indicating that the breaker has tripped. The current level, corresponding to a threshold current level, and the value of the Dpot when the breaker is tripped are stored (step 1535). The I/O is then reset (step 1540) and the threshold current trip time is determined beginning with step 1545.

FIG. 15b shows the procedure for determining the trip time for the threshold current level beginning with step 1545. The Dpot is set to the stored value (step 1550) and the A-to-D is set at a pre-determined sampling rate (step 1552). As the A-to-D starts collecting data samples (step 1554), the tester is triggered (step 1556). While the line voltage is present (step 1564), values are read from the A-to-D (steps 1558 and 1560) and stored (step 1562). When the line voltage is no longer present (step 1564), indicating that the GFCI device has tripped the breaker, the tester is reset (step 1566). The stored time and current data values are retrieved (steps 1568 and 1570) and a waveform is displayed (steps 1572 and 1574). A determination is made as to whether the threshold test results are in compliance with the requirements of UL 943 (step 1578) and the results are displayed or printed as graph (step 1580). Finally, data corresponding to the test results are appended to a test data file as part of a data packet for the GFCI device (step 1582) and the routine returns to the main testing procedure (step 1584).

Figure 16:
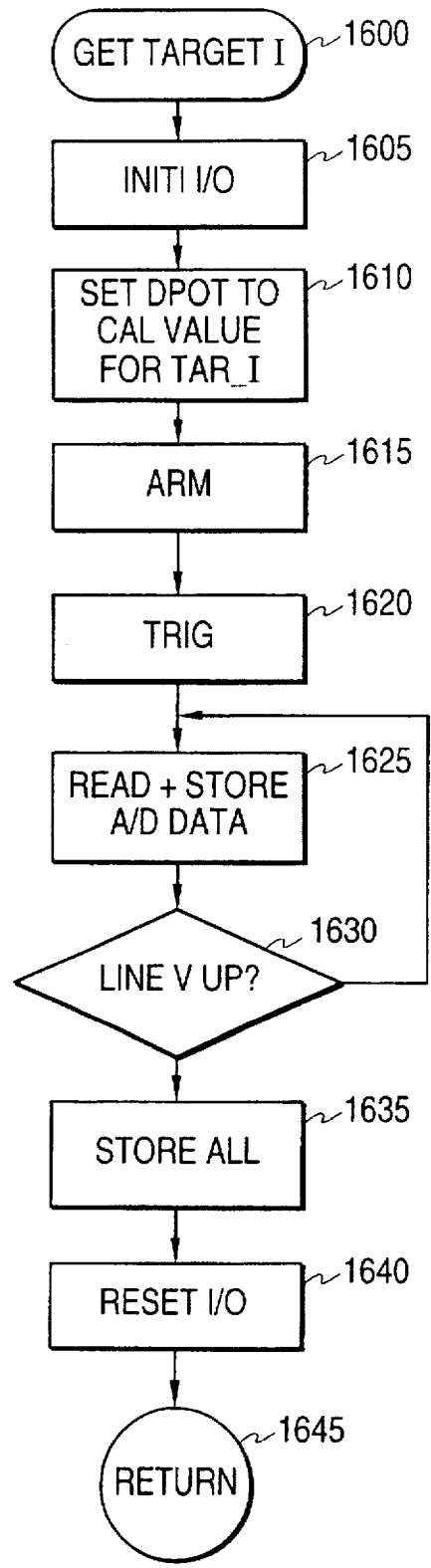

FIG. 16 shows a procedure for a trip time test according to the invention for a target current. First, the target current is determined (step 1600). The I/O is initialized (step 1605) and the Dpot is set to the previously calibrated value for the target current (step 1610). The tester is armed (step 1615) and triggered (step 1620). The A-to-D samples at a pre-determined sampling rate (step 1625). While the line voltage is present (step 1630), values are read from the A-to-D and stored (step 1625). When the line voltage is no longer present (step 1630), indicating that the GFCI device has tripped the breaker, the trip time is determined and stored (step 1635). Data corresponding to the test results are appended to the test data file as part of the data packet for the GFCI device (step 1635). The I/O is then reset (step 1640) and the routine returns to the main testing procedure (step 1645).

What is claimed is:

1. An apparatus for testing a ground fault circuit interrupt device, said apparatus comprising:
    a processor;
    an input device coupled to said processor for receiving input from an operator;
    an output device coupled to said processor for outputting information corresponding to test data to said operator;
    a logging device coupled to said processor for logging said test data; and
    a calibrated variable load circuit coupled between said processor and said around fault circuit interrupt device, wherein said around fault circuit interrupt device is configured to trip a corresponding circuit breaker, wherein
        said processor is configured to receive signals from said calibrated variable load circuit and to process said signals to determine one of a trip threshold current and a trip time,
        and wherein said calibrated variable load circuit comprises a leakage resistance switching matrix.

2. The apparatus as recited in claim 1, wherein said calibrated variable load circuit further comprises a current viewing resistor.

3. The apparatus as recited in claim 1, wherein said output device produces a graph of said test data corresponding to a life code safety curve.

4. The apparatus as recited in claim 1, wherein said apparatus is configured to provide a trend of performance for said ground fault circuit interrupt device.

5. The apparatus as recited in claim 1, wherein said ground fault circuit interrupt device includes an identification, and wherein said test data is logged on said logging device in accordance with said identification.

6. The apparatus as recited in claim 5, wherein test data from an initial test logged in accordance with said identification is compared with test data from a subsequent test logged in accordance with said identification to provide a trend of performance for said ground fault circuit interrupt device.

7. An apparatus for testing a ground fault circuit interrupt device, said apparatus comprising:
    a processor;
    an input device coupled to said processor for receiving input from an operator;
    an output device coupled to said processor for outputting information corresponding to test data to said operator;
    a logging device coupled to said processor for logging said test data; and
    a calibrated variable load circuit coupled between said processor and said around fault circuit interrupt device, wherein said ground fault circuit interrupt device is configured to trip a corresponding circuit breaker, wherein
        said processor is configured to receive signals from said calibrated variable load circuit and to process said signals to determine one of a trip threshold current and a trip time,
        and wherein said calibrated variable load circuit is self-calibrating.

8. The apparatus as recited in claim 7, wherein said output device produces a graph of said test data corresponding to a life code safety curve.

9. The apparatus as recited in claim 7, wherein said apparatus is configured to provide a trend of performance for said ground fault circuit interrupt device.

10. The apparatus as recited in claim 7, wherein said ground fault circuit interrupt device includes an identification, and wherein said test data is logged on said logging device in accordance with said identification.

11. The apparatus as recited in claim 10, wherein test data from an initial test logged in accordance with said identification is compared with test data from a subsequent test logged in accordance with said identification to provide a trend of performance for said ground fault circuit interrupt device.

12. An apparatus for testing a around fault circuit interrupt device, said apparatus comprising:
    a processor;
    an input device coupled to said processor for receiving input from an operator;
    an output device coupled to said processor for outputting information corresponding to test data to said operator;
    a logging device coupled to said processor for logging said test data; and
    a calibrated variable load circuit coupled between said processor and said ground fault circuit interrupt device, wherein said ground fault circuit interrupt device is configured to trip a corresponding circuit breaker, wherein
        said processor is configured to receive signals from said calibrated variable load circuit and to process said signals to determine one of a trip threshold current and a trip time,
        said calibrated variable load circuit measures a line voltage corresponding to said ground fault circuit interrupt device,
        and wherein said calibrated variable load circuit selects a load resistance in accordance with a predetermined leakage current and said line voltage.

13. The apparatus as recited in claim 12, wherein said output device produces a graph of said test data corresponding to a life code safety curve.

14. The apparatus as recited in claim 12, wherein said apparatus is configured to provide a trend of performance for said ground fault circuit interrupt device.

15. The apparatus as recited in claim 12, wherein said ground fault circuit interrupt device includes an identification, and wherein said test data is logged on said logging device in accordance with said identification.

16. The apparatus as recited in claim 15, wherein test data from an initial test logged in accordance with said identification is compared with test data from a subsequent test logged in accordance with said identification to provide a trend of performance for said ground fault circuit interrupt device.

17. An apparatus for testing a ground fault circuit interrupt device, said apparatus comprising:
    a processor;
    an input device coupled to said processor for receiving input from an operator;
    an output device coupled to said processor for outputting information corresponding to test data to said operator;
    a logging device coupled to said processor for logging said test data; and
    a calibrated variable load circuit coupled between said processor and said ground fault circuit interrupt device, wherein said around fault circuit interrupt device is configured to trip a corresponding circuit breaker, wherein said processor is configured to receive signals from said calibrated variable load circuit and to process said signals to determine one of a trip threshold current and a trip time, said apparatus is configured to provide a trend of performance for said ground fault circuit interrupt device, and wherein said ground fault circuit interrupt device includes an identification, and wherein said test data is logged on said logging device in accordance with said identification.

18. The apparatus as recited in claim 17, wherein test data from an initial test logged in accordance with said identification is compared with test data from a subsequent test logged in accordance with said identification to provide said trend of performance for said ground fault circuit interrupt device.

19. An apparatus for testing a ground fault circuit interrupt device, said ground fault circuit interrupt device including a low voltage line and a high voltage line, said apparatus comprising:

means for measuring a line voltage at the ground fault circuit interrupt device;

a variable load resistor;

a memory for storing an application program;

a processor coupled to the memory and to the variable load resistor, the processor configured to read and execute the application program stored in the memory and to select a load resistance for the variable load resistor, based on the measured line voltage, so as to cause a leakage current to flow between the low and high voltage lines of the ground fault circuit interrupt device;

means for connecting the variable load resistor to the ground fault circuit interrupt device; and means for determining when the ground fault circuit interrupt device has tripped a corresponding circuit breaker, wherein, if the circuit breaker does not trip in response to the variable load resistor being connected to the ground fault circuit interrupt device by the means for connecting, the processor re-selects the load resistance for the variable load resistor in order to cause an increased amount of leakage current to flow between the low and high voltage lines, and wherein one of a trip threshold and a trip time for the ground fault circuit interrupt device is determined based on when the circuit breaker trips.

20. A method of testing a ground fault circuit interrupt device, said method comprising the steps of:

(A) providing a ground fault circuit interrupt device tester configured to generate test data including one of a trip threshold and a trip time of said ground fault circuit interrupt device;

(B) providing an identification for said ground fault circuit interrupt device; and (C) recording said test data in association with said identification.

21. The method as recited in claim 20, comprising the further step of:

(D) comparing test data from an initial test recorded in accordance with said identification with test data from a subsequent test recorded in accordance with said identification to determine a trend of performance for said ground fault circuit interrupt device.

22. A method of testing a ground fault circuit interrupt device, said method comprising the steps of:

(A) providing a ground fault circuit interrupt device tester configured to generate test data including one of a trip threshold and a trip time of said ground fault circuit interrupt device;

(B) connecting said ground fault circuit interrupt device tester to said ground fault circuit interrupt device;

(C) calibrating a load value of said ground fault circuit interrupt device tester prior to generating said test data; and (D) performing a test on said ground fault circuit interrupt device with said ground fault circuit interrupt device tester using said load calibrated in step (C) to generate said test data.

* * * * *